United States Patent
Ahn et al.

(10) Patent No.: US 8,097,480 B2
(45) Date of Patent: Jan. 17, 2012

(54) LIQUID CRYSTAL DISPLAY AND METHOD OF MAKING THE SAME

(75) Inventors: Ki-wan Ahn, Seoul (KR); Jae-seong Byun, Suwon-si (KR); In-sung Lee, Seoul (KR); Dong-hyuk Kim, Suwon-si (KR); Jung-mok Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 66 days.

(21) Appl. No.: 12/762,571

(22) Filed: Apr. 19, 2010

(65) Prior Publication Data

US 2011/0104838 A1     May 5, 2011

Related U.S. Application Data

(62) Division of application No. 11/439,645, filed on May 24, 2006, now abandoned.

(30) Foreign Application Priority Data

May 24, 2005     (KR) .......................... 10-2005-0043491

(51) Int. Cl.
    *H01L 21/00*     (2006.01)
(52) U.S. Cl. .......................................................... 438/30
(58) Field of Classification Search ...................... 438/30
    See application file for complete search history.

(56) References Cited

U.S. PATENT DOCUMENTS

| | | |
|---|---|---|
| 5,285,301 A | 2/1994 | Shirahashi et al. |
| 5,541,748 A | 7/1996 | Ono et al. |
| 6,011,608 A | 1/2000 | Tanaka |
| 6,208,399 B1 | 3/2001 | Ohta et al. |
| 6,803,983 B2 | 10/2004 | Kwak et al. |
| 6,806,937 B2 | 10/2004 | Park et al. |
| 6,819,389 B2 | 11/2004 | Imayama et al. |
| 6,853,405 B2 | 2/2005 | Lee |
| 6,853,421 B2 | 2/2005 | Sakamoto et al. |

(Continued)

FOREIGN PATENT DOCUMENTS

CN          1402064 A          3/2003
(Continued)

OTHER PUBLICATIONS

Machine translation of Japanese Patent Publication JP 2004-013044 A, by Kojima Tetsuhiko, et al.

(Continued)

*Primary Examiner* — Bradley K Smith
(74) *Attorney, Agent, or Firm* — Cantor Colburn LLP

(57) ABSTRACT

A method of making a liquid crystal display having a display region and a non-display region, the method comprises forming a thin film transistor ("TFT") having a drain electrode on an insulating substrate, forming an inorganic layer and an organic insulating layer sequentially on the TFT, forming an organic insulating layer pattern, by patterning the organic insulating layer, comprising a first organic layer hole to expose the inorganic layer on the drain electrode and a second organic layer hole formed along a circumference of the display region where the organic insulating layer is partially removed, removing the inorganic layer exposed through the first organic layer hole and the organic insulating layer remaining in the second organic layer hole, and forming a sealant in the second organic hole. The present invention thus provides a method of making an LCD to prevent a color filter substrate separating from a TFT substrate using fewer masks.

14 Claims, 24 Drawing Sheets

U.S. PATENT DOCUMENTS

| | | |
|---|---|---|
| 6,861,297 B2 | 3/2005 | Kwak et al. |
| 6,862,069 B2 | 3/2005 | Kwak et al. |
| 2001/0022639 A1 | 9/2001 | Kwak et al. |
| 2003/0122978 A1* | 7/2003 | Lim ............................ 349/42 |
| 2004/0018669 A1 | 1/2004 | Song |
| 2004/0125314 A1 | 7/2004 | Choi |
| 2004/0196228 A1 | 10/2004 | Ahn |
| 2004/0239826 A1 | 12/2004 | Park et al. |
| 2004/0241895 A1 | 12/2004 | Baek et al. |
| 2005/0078264 A1 | 4/2005 | Yoo et al. |

FOREIGN PATENT DOCUMENTS

| | | |
|---|---|---|
| CN | 1514289 A | 7/2004 |
| JP | 09-171193 A | 6/1997 |
| JP | 10-325967 A | 12/1998 |
| JP | 2002-182243 A | 6/2002 |
| JP | 2004-013044 A | 1/2004 |
| JP | 2004-053815 A | 2/2004 |
| KR | 1020010105058 A | 11/2001 |
| KR | 1020030035860 A | 5/2003 |
| KR | 1020030094606 A | 12/2003 |
| KR | 0484952 B1 | 4/2005 |
| TW | I291589 | 12/2007 |

OTHER PUBLICATIONS

Chinese Office Action with English Translation for application No. 2006100809064 dated Oct. 12, 2007.

* cited by examiner 110 123  131 122 132 133

110 123   131 122 132 133   140

LIQUID CRYSTAL DISPLAY AND METHOD OF MAKING THE SAME

CROSS REFERENCE TO RELATED APPLICATIONS

This application is a divisional of U.S. application Ser. No. 11/439,645, filed on May 24, 2006, which claims priority to Korean Patent Application No. 2005-0043491, filed on May 24, 2005, and all the benefits accruing therefrom under 35 U.S.C. §119, and the contents of which in its entirety are herein incorporated by reference.

BACKGROUND OF THE INVENTION

1. Field of the Invention

The present invention relates to a liquid crystal display that uses an organic layer and method of making the same.

2. Description of the Related Art

A liquid crystal display ("LCD") comprises an LCD panel, a backlight unit, a driving part and a cover. The LCD panel includes a thin film transistor ("TFT") substrate on which thin film transistors ("TFTs") are formed, a color filter substrate on which color filters are formed, liquid crystals disposed between the TFT and color filter substrates and a sealant formed along the circumferences of both substrates to prevent leakage of the liquid crystals.

Lines such as gate lines, data lines and etc. are formed on the TFT substrate and a pixel electrode is disposed over the lines. A passivation layer is formed between the lines and the pixel electrode to insulate the lines and pixel electrode from each other. The passivation layer comprises an inorganic layer of silicon nitride (SiNx) or the like and is deposited on the lines by a chemical vapor deposition ("CVD") method.

When the lines are close to the pixel electrode, cross talk is generated therebetween. Thus, an organic layer, instead of the inorganic layer, has been recently used to prevent the generation of cross talk. The organic layer is formed on the lines, not by the CVD method but, by a spin coating method, a slit coating method or the like, and thus the organic layer may thicken. Accordingly, the pixel electrode may be formed close to the lines or on the lines, thereby increasing an aperture ratio as well. Further, if the organic layer comprises material having a low dielectric constant, even generation of the cross talk decreases.

In the case of a transflective TFT substrate, the organic layer is used to form a lens part of a reflecting layer.

However, when a semiconductor layer contacts the organic layer, impurities from the organic layer badly affect the semiconductor layer, thereby deteriorating characteristics of the semiconductor layer. To solve this problem, an inorganic layer is formed between the semiconductor layer and the organic layer. In this case, however, more masks are needed to pattern both the inorganic layer and the organic layer. In particular, seven masks are used to make the transflective TFT substrate and six masks are used to make the transmissive TFT substrate, respectively.

When the organic layer is used as the passivation layer, the sealant is disposed on the organic layer. However, the organic layer and the sealant do not adhere to each other very well, thereby allowing the color filter substrate to easily separate from the TFT substrate.

BRIEF SUMMARY OF THE INVENTION

Accordingly, it is an aspect of the present invention to provide a method of making an LCD to prevent a color filter substrate separating from a TFT substrate while using fewer masks to make the LCD.

Another aspect of the present invention is to provide an LCD in which separation of a color filter substrate from a TFT substrate is prevented.

The foregoing and/or other aspects of the present invention are achieved by an exemplary embodiment of a method of making a liquid crystal display having a display region and a non-display region. The method includes forming a thin film transistor (TFT) having a drain electrode on an insulating substrate, sequentially forming an inorganic layer and an organic insulating layer on the TFT, forming an organic insulating layer pattern, by patterning the organic insulating layer, comprising a first organic layer hole to expose the inorganic layer on the drain electrode and a second organic layer hole formed along a circumference of the display region where the organic insulating layer is partially removed, removing the inorganic layer exposed through the first organic layer hole and the organic insulating layer remaining in the second organic layer hole, and forming a sealant in the second organic hole.

According to an exemplary embodiment of the present invention, the forming the organic insulating layer pattern includes forming a lens part on the display region.

According to an exemplary embodiment of the present invention, the forming the organic insulating layer pattern includes exposing the organic insulating layer to light, an exposure intensity of light is about 70 to about 80 percent in an area of the second organic layer hole and about 20 to about 32 percent in an area of the lens part as compared with one in an area of the first organic layer hole.

According to an exemplary embodiment of the present invention, the forming the organic insulating layer pattern further includes exposing the organic insulating layer to light with a mask for an organic layer, the mask for the organic layer includes a molybdenum silicon layer corresponding to the lens part and a slit-patterned molybdenum silicon layer corresponding to the second organic layer hole.

According to an exemplary embodiment of the present invention, the method of making a liquid crystal display further includes forming a pixel electrode connected to the drain electrode and forming a reflecting layer connected to the pixel electrode, the reflecting layer includes a transmitting window.

According to an exemplary embodiment of the present invention, the inorganic layer includes at least one of silicon oxide and silicon nitride.

According to an exemplary embodiment of the present invention, the organic insulating layer includes either benzocyclobutene or acrylic resin.

According to an exemplary embodiment of the present invention, the inorganic layer includes a gate insulating layer and an inorganic passivation layer.

According to an exemplary embodiment of the present invention, forming the TFT includes forming a gate line assembly and sequentially forming a gate insulating layer, a semiconductor layer, an ohmic contact layer and a data line assembly on the gate line assembly.

According to an exemplary embodiment of the present invention, the semiconductor layer, the ohmic contact layer and the data line assembly are patterned using a single mask.

According to an exemplary embodiment of the present invention, the ohmic contact layer and the data line assembly are patterned to be layered upon each other.

The foregoing and/or other aspects of the present invention are achieved by another exemplary embodiment of a method of making a liquid crystal display having a display region and a non-display region. The method includes forming a thin film transistor (TFT) having a drain electrode on an insulating substrate, sequentially forming an inorganic layer and an organic insulating layer on the TFT, forming an organic insulating layer pattern, by patterning the organic insulating layer, comprising a first organic layer hole to expose the inorganic layer on the drain electrode and a second organic layer hole formed along a circumference of the display region, removing the inorganic layer exposed through the first organic layer hole and the inorganic layer remaining in the second organic layer hole, and forming a sealant in the second organic hole.

The foregoing and/or other aspects of the present invention are achieved by an exemplary embodiment of a liquid crystal display including an insulating substrate, an inorganic layer and an organic insulating layer sequentially formed on the insulating substrate, a sealant contact hole formed along a circumference of a display region where the organic insulating layer is removed exposing the inorganic layer, and a sealant disposed in the sealant contact hole.

According to an exemplary embodiment of the present invention, the inorganic layer exposed through the sealant contact hole includes at least one of silicon oxide and silicon nitride.

According to an exemplary embodiment of the present invention, the liquid crystal display further includes a semiconductor layer, an ohmic contact layer and a data line assembly which are sequentially deposited on the insulating substrate, wherein the data line assembly and the ohmic contact layer are layered upon each other.

According to an exemplary embodiment of the present invention, the liquid crystal display further includes a gate line assembly formed on the insulating substrate, wherein the inorganic layer exposed through the sealant contact hole includes a gate insulating layer formed on the gate line assembly or an inorganic passivation layer formed on the data line assembly.

According to an exemplary embodiment of the present invention, the liquid crystal display further includes a pixel electrode connected to the data line assembly; and a reflecting layer covering a portion of the pixel electrode.

According to an exemplary embodiment of the present invention, the liquid crystal display further includes a gate driving circuit disposed under the sealant contact hole and formed on the insulating substrate.

BRIEF DESCRIPTION OF THE DRAWINGS

The above and/or other aspects and advantages of the present invention will become apparent and more readily appreciated from the following detailed description of the exemplary embodiments, taken in conjunction with the accompanying drawings of which.

DETAILED DESCRIPTION OF THE INVENTION

Figure 1:
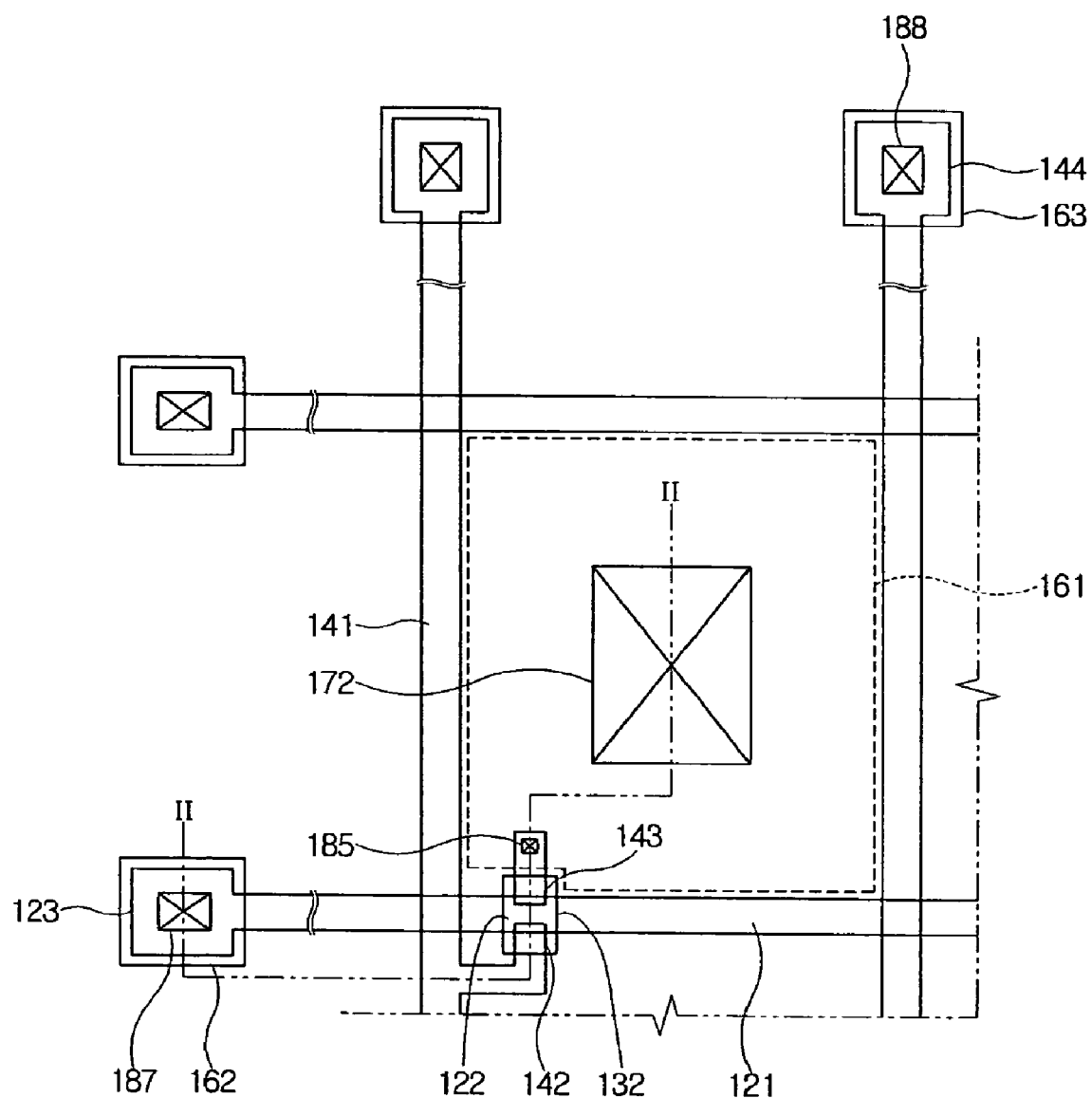
FIG. 1 is a plan view of a first exemplary embodiment of a TFT substrate of an LCD panel according to the present invention.

The exemplary embodiments of the present invention will now be described with reference to the attached drawings. The present invention may, however, be embodied in different forms and thus the present invention should not be construed as being limited to the exemplary embodiments set forth herein. Rather, these exemplary embodiments are provided so that this disclosure will be thorough and complete, and will fully convey the scope of the invention to those skilled in the art.

In the drawings, the thickness of the layers, films, and regions are exaggerated for clarity. When an element such as a layer, film, region, or substrate is referred to as being "on" another element, it can be directly on the other element or intervening elements may also be present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following first exemplary embodiment of the present invention, a TFT substrate will be described with a transflective TFT substrate as an example.

Figure 2:
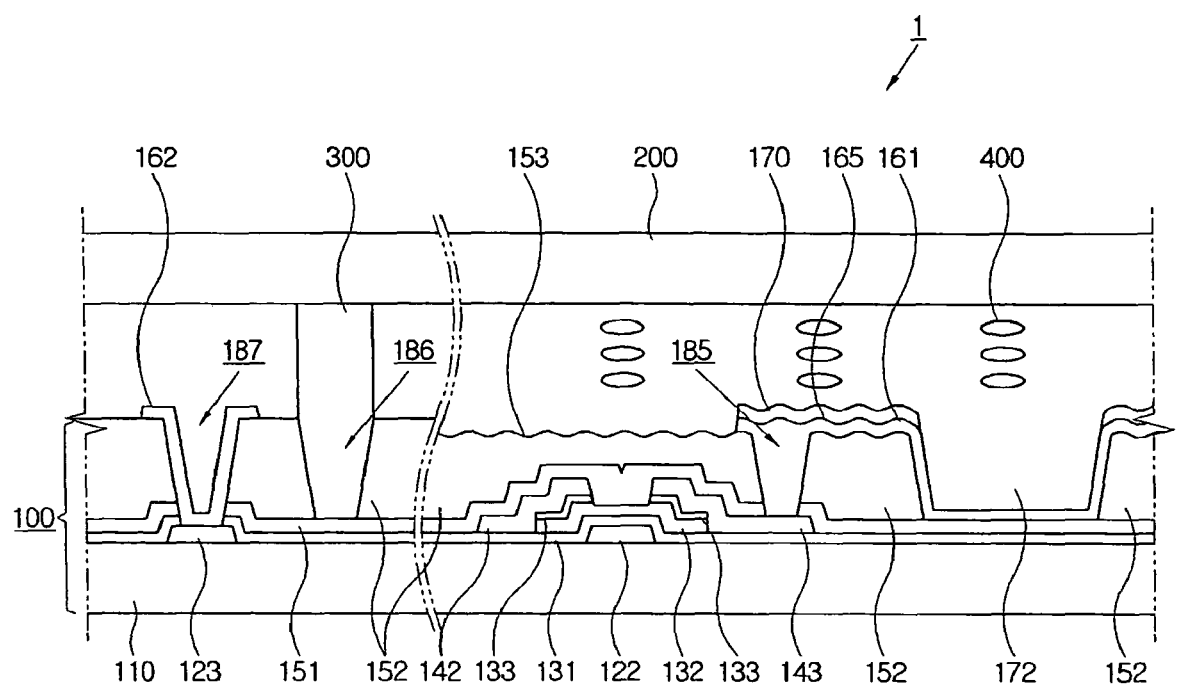
FIG. 2 is a cross-sectional view of the LCD panel taken along line II-II of FIG. 1.

FIG. 1 is a plan view of a first exemplary embodiment a TFT substrate of an LCD panel 1 according to the present invention. FIG. 2 is a cross-sectional view of the LCD panel 1 taken along line II-II of FIG. 1.

A gate line assembly 121, 122 and 123 is formed on an insulating substrate 110 (FIG. 2).

The gate line assembly 121, 122 and 123 comprises a plurality of gate lines 121 and disposed parallel with each other at a predetermined interval, a gate electrode 122 of a portion of the gate line 121 for forming a TFT and a gate pad 123 connecting the gate line 121 and an integrated circuit or external circuit. The gate pad 123 is wider than the gate line 121. The gate line assembly 121, 122 and 123 may be a single-layer or multi-layer structure and may comprise metal.

A gate insulating layer 131 is formed on the gate line assembly 121, 122 and 123. The gate insulating layer 131 comprises an inorganic material such as silicon nitride. The gate insulating layer 131 is not formed in a gate pad contact hole 187.

A semiconductor layer 132 is disposed over the gate electrode 122 and comprises amorphous silicon. An ohmic contact layer 133 is formed on the semiconductor layer 132 and is divided into two parts with respect to the gate electrode 122. The ohmic contact layer 133 comprises n+silicon.

A data line assembly 141, 142, 143 and 144 comprises a plurality of data lines 141 disposed parallel with each other and perpendicular to the gate lines 121. The data line assembly further comprises a source electrode 142 branched from the data line 141, a drain electrode 143 disposed opposite to the source electrode 142 across the gate electrode 122 and a data pad 144. The data pad 144 connects the data line 141 and the integrated circuit or external circuit and is wider than the data line 141. The data line assembly 141, 142, 143 and 144 may comprise aluminum, chrome, molybdenum or alloys thereof and may be a multi-layer structure.

An inorganic passivation layer 151 is formed on the data line assembly 141, 142, 143 and 144 and the semiconductor layer 132 not covered with the data line assembly 141, 142, 143 and 144. The inorganic passivation layer 151 generally comprises silicon nitride. The inorganic passivation layer 151 is removed from the gate pad contact hole 187, a data pad contact hole 188 and a drain contact hole 185.

An organic insulating layer 152 is formed on the inorganic passivation layer 151. The organic insulating layer 152 may comprise either benzocyclobutene or acrylic resin, which is a photoresist and forms a lens part 153 in a reflecting region to increase reflectability. The organic insulating layer 152 is removed from not only the gate pad contact hole 187, the data pad contact hole 188 and the drain contact hole 185 similarly to the inorganic passivation layer 151, but a sealant contact hole 186 and a transmitting window 172. The lens part 153 is formed on the organic insulating layer 152.

A transparent electrode 161, 162, 163 is formed on the organic insulating layer 152. The transparent electrode 161, 162, 163 comprises the pixel electrode 161 (shown with dashed lines in FIG. 1) and auxiliary contact members 162 and 163. The pixel electrode 161 is electrically connected to the drain electrode 143 through the drain contact hole 185 and forms a pixel region. The auxiliary contact members 162 and 163 are each connected to the gate pad 123 and the data pad 144, respectively, through the gate pad contact hole 187 and the data pad contact hole 188, respectively. The pixel electrode 161 and the auxiliary contact members 162 and 163 comprise indium tin oxide (ITO) or indium zinc oxide (IZO).

The lens part 165 is formed on the pixel electrode 161 and a reflecting layer 170 is formed on the lens part 165. The reflecting part 170 generally comprises aluminum or silver and may be a double layer of aluminum/molybdenum.

The reflecting layer 170 is electrically connected to the drain electrode 143 through the pixel electrode 161 and removed from the transmitting window 172, the organic insulating layer 153 on the source electrode 142 and the drain electrode 143, the gate line 121 and a non-display region.

In the TFT substrate 100 with this configuration, the integrated circuit or external circuit is connected to the gate line 121 and the data line 141 through the gate pad 123 and the data pad 144, respectively.

A color filter substrate 200 [Note "200" not depicted in FIG. 2] is disposed over the TFT substrate 100. Both substrates 100 and 200 are supported and adhere to each other by a sealant 300 formed between the TFT substrate 100 and the color filter substrate 200 and within the sealant contact hole 186. Liquid crystals 400 are disposed in a display region defined by the sealant 300.

Hereinafter, a first exemplary embodiment of a method of manufacturing the TFT substrate according to the present invention will be described in detail with reference to FIGS. 3A through 3F.

FIGS. 3A through 3F are cross-sectional views showing the method of manufacturing the TFT substrate according to the first exemplary embodiment of the present invention.

Figure 3A:
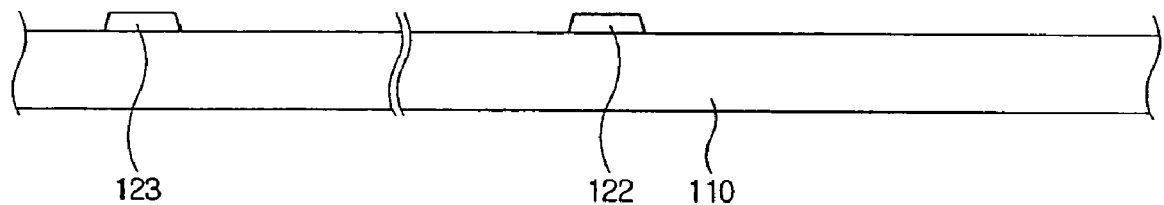
FIGS. 3A through 3G are cross-sectional views showing a first exemplary embodiment of a method of manufacturing the TFT substrate according to the present invention.

Referring to FIG. 3A, a gate metal layer is deposited on the insulating substrate 110 and patterned using a first mask (not shown) to form the gate line 121 (FIG. 1), the gate electrode 122 and the gate pad 123.

Figure 3B:
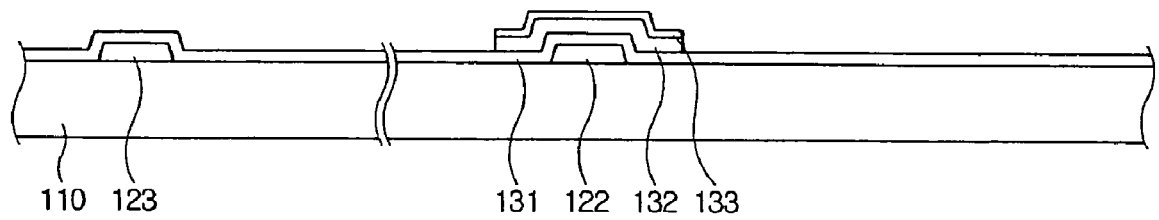

Referring to FIG. 3B, the gate insulating layer 131, the semiconductor layer 132 and the ohmic contact layer 133 are sequentially formed in the above order.

In more detail, the gate insulating layer 131 comprising an inorganic substance such as silicon nitride or the like is deposited. Then, the semiconductor layer 132 of amorphous silicon and the ohmic contact layer 133 of n+ silicon are sequentially deposited. That is, a triple layer of the gate insulating layer 131, the semiconductor layer 132 and the ohmic contact layer 133 are sequentially deposited in the above enumerated order. The semiconductor layer 132 and the ohmic contact layer 133 are patterned using a second mask (not shown) such that the semiconductor layer 132 and the ohmic contact layer 133 only remain on the gate electrode 122. The semiconductor layer 132 and the ohmic contact layer 133 may be formed on an area where the gate line 121 overlaps the data line 141 as required.

Figure 3C:
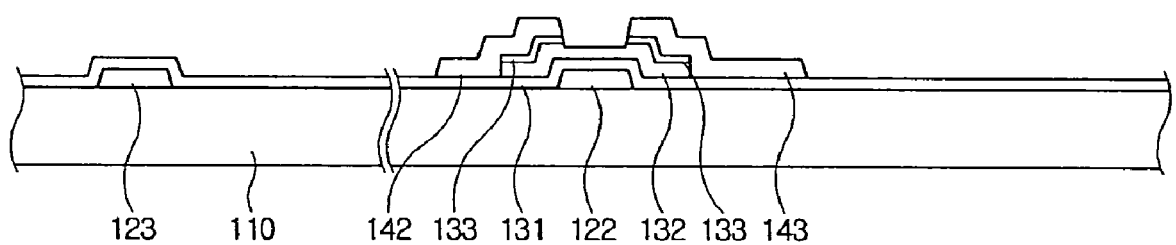

Referring to FIG. 3C, a data metal layer is deposited thereon and patterned using a third mask (not shown) to form the data line 141, the source electrode 142, the drain electrode 143 and the data pad 144.

Figure 3D:
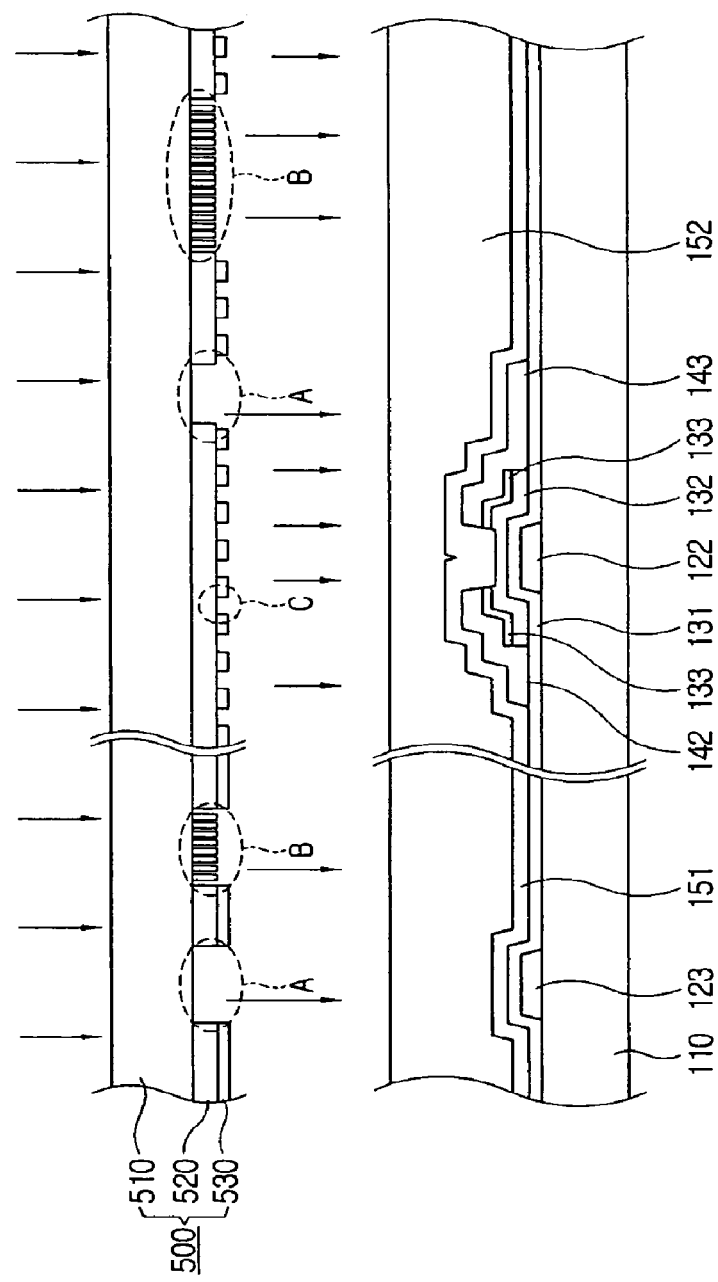

Referring to FIG. 3D, the inorganic passivation layer 151 and the organic insulating layer 152 are sequentially deposited and patterned using a fourth mask. The inorganic passivation 151 comprises either silicon oxide or silicon nitride. The organic insulating layer 152 comprises either benzocyclobutene or acrylic resin.

A patterning process of the organic insulating layer 152 comprises an exposing process of the organic insulating layer 152. A mask 500 for an organic layer used in these exposing processes comprises a molybdenum silicon layer 520 and a chrome layer 530, which are sequentially deposited on a quartz substrate 510 and removed from an area A corresponding to a first organic layer hole 181 and a gate pad contact hole forming part 183 (see FIG. 3E). The chrome layer 530 removed from and the molybdenum silicon layer 520 is slit in an area B corresponding to a second organic layer hole 182 and a transmitting window forming part 184 (see FIG. 3E). Further, the chrome layer 530 is formed on the molybdenum silicon layer 520 at a regular interval in an area C corresponding to the lens part 153 (see FIG. 3E). Herein, the area B of the second organic layer hole 182 and the transmitting window forming part 184 has 70 to 80 percent exposure intensity of the area A of the first organic layer hole 181 and the gate pad contact hole forming part 183. The area C of the lens part 153 has 20 to 32 percent exposure intensity of the area A of the first organic layer hole 181 and the gate pad contact hole forming part 183.

Figure 3E:
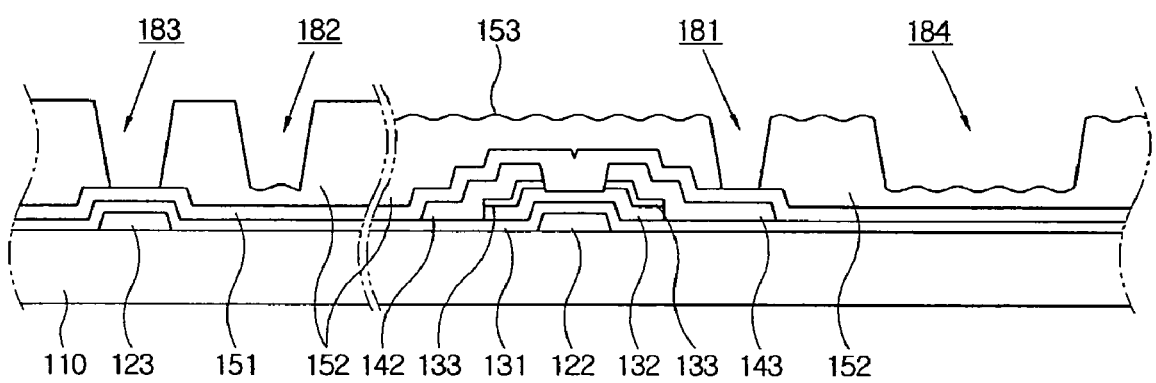

FIG. 3E is a cross-sectional view of the TFT substrate 100 of which the organic insulating layer 152 is patterned.

The first organic layer hole 181 exposing the inorganic passivation layer 151 on the drain electrode 143 and the gate pad contact hole forming part 183 exposing the inorganic passivation layer 151 over the gate pad 123 are formed. Then, the second organic layer hole 182 formed along a circumference of the display region of the LCD panel 1 and the transmitting window forming part 184, where the organic insulating layer 152 is substantially removed, are both formed. The lens part 153 is formed on the organic insulating layer 152. In other words, the organic insulating layer 152 is patterned to form a concavo-convex shape, is applied with heat, and then reflows, thereby forming the lens part 153 having a wave shape. The reflecting layer 170 becomes the same as the lens part 153, thereby efficiently reflecting light from the outside.

Figure 3F:
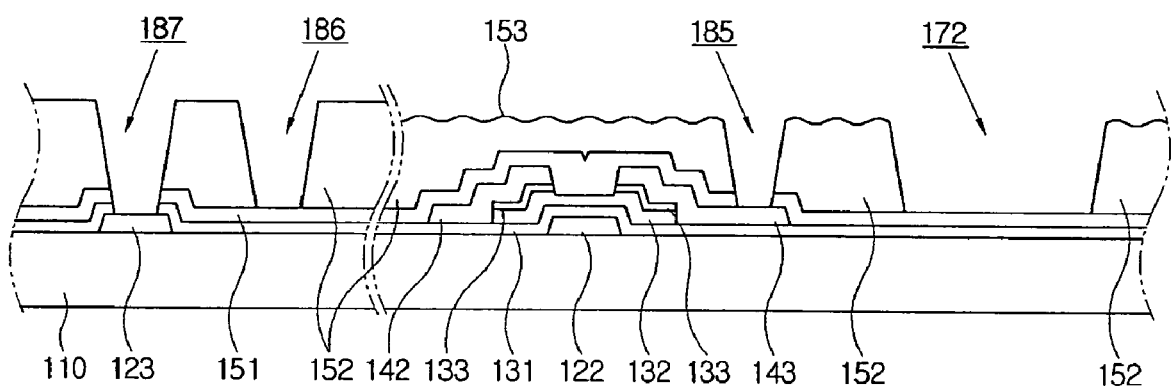

Referring to FIG. 3F, the inorganic passivation layer 151 of the first organic layer hole 181 on the drain electrode 143, and the inorganic passivation layer 151 and the gate insulating layer 131 under the inorganic passivation layer 151 of the gate pad contact hole forming part 183 are removed using an organic layer pattern as a mask, thereby forming the drain contact hole 185 and the gate pad contact hole 187.

While the inorganic layers 131 and 151 are removed, the organic insulating layer 152 remaining in the second organic layer hole 182 and the transmitting window forming part 184 is removed to form the sealant contact hole 186 and the transmitting widow 172. The inorganic passivation layer 151 may be removed to expose the gate insulating layer 131 in the sealant contact hole 186. That is, the inorganic layers 131 and 151 have only to be exposed. Likewise, the inorganic passivation layer 151 may be removed to expose the gate insulating layer 131 and a little portion of the organic insulating layer 152 may remain in the transmitting window 172.

As described above, an additional mask is not needed to remove the inorganic passivation layer 151, thereby reducing the number of masks. Further, the inorganic passivation layer 151 and the gate insulating layer 131 may both comprise silicon nitride, thereby being etched at the same time.

Figure 3G:
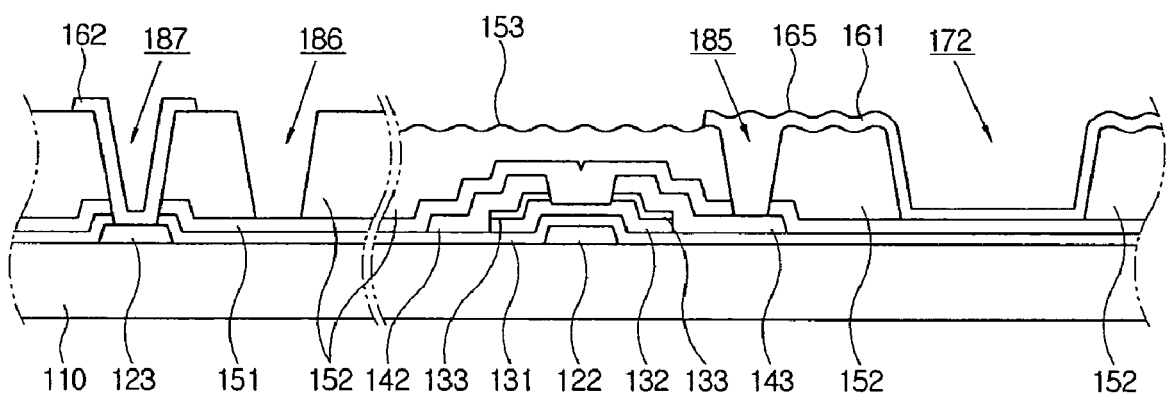

FIG. 3G is a cross-sectional view of the TFT substrate 100 where the transparent electrode 161, 162, 163 is formed by a fifth mask (not shown). The transparent electrode 161, 162, 163 comprises the pixel electrode 161 and the auxiliary contact members 162 and 163. The pixel electrode 161 is electrically connected to the drain electrode 143 through the drain contact hole 185 and has a lens part 165 having a wave shape like the lens part 153 on the organic insulating layer 152. Also, the auxiliary contact members 162 and 163 are each connected to the gate pad 123 and the data pad 144, respectively, through the gate pad contact hole 187 and the data pad contact hole 188, respectively.

Then, the reflecting layer 170, as shown in FIG. 2, is formed by a sixth mask (not shown) on the pixel electrode 161, thereby completing the TFT substrate 100. The reflecting layer 170 comprises chrome, silver or alloys thereof and may be an aluminum layer or a double layer of aluminum/molybdenum. The reflecting layer 170 is formed on the pixel electrode 161 except for the transmitting window 172. As mentioned before, the reflecting layer 170 is formed on the lens part 165, so that it too has the wave shape like the lens part 165. The reflecting layer 170 is electrically connected to the drain electrode 143 through the pixel electrode 161, thereby being receiving an electric signal from the drain electrode 143 and applying it to the liquid crystals 400 disposed on the reflecting layer 170. Accordingly, the transflective TFT substrate may be formed using only six masks.

Next, the sealant 300 is formed in the sealant contact hole 186 of the TFT substrate 100 and adheres the TFT substrate 100 to the color filter substrate 200. Then, the liquid crystals 400 are interposed between the substrates 100 and 200, thereby completing the LCD panel 1 in FIG. 2. Herein, the sealant 300 may be formed along the circumference of the color filter substrate 200, and then sealant 300 adheres to the TFT substrate 100.

In the LCD panel 1 manufactured above, the sealant 300 adheres to the inorganic layers 131 and 151 through the sealant contact hole 186 where the organic insulating layer 152 is removed. The sealant 300 and the inorganic layers 131 and 151 adhere to each other with a comparatively strong bond, thereby preventing the color filter substrate 200 separating from the TFT substrate 100.

Figure 4:
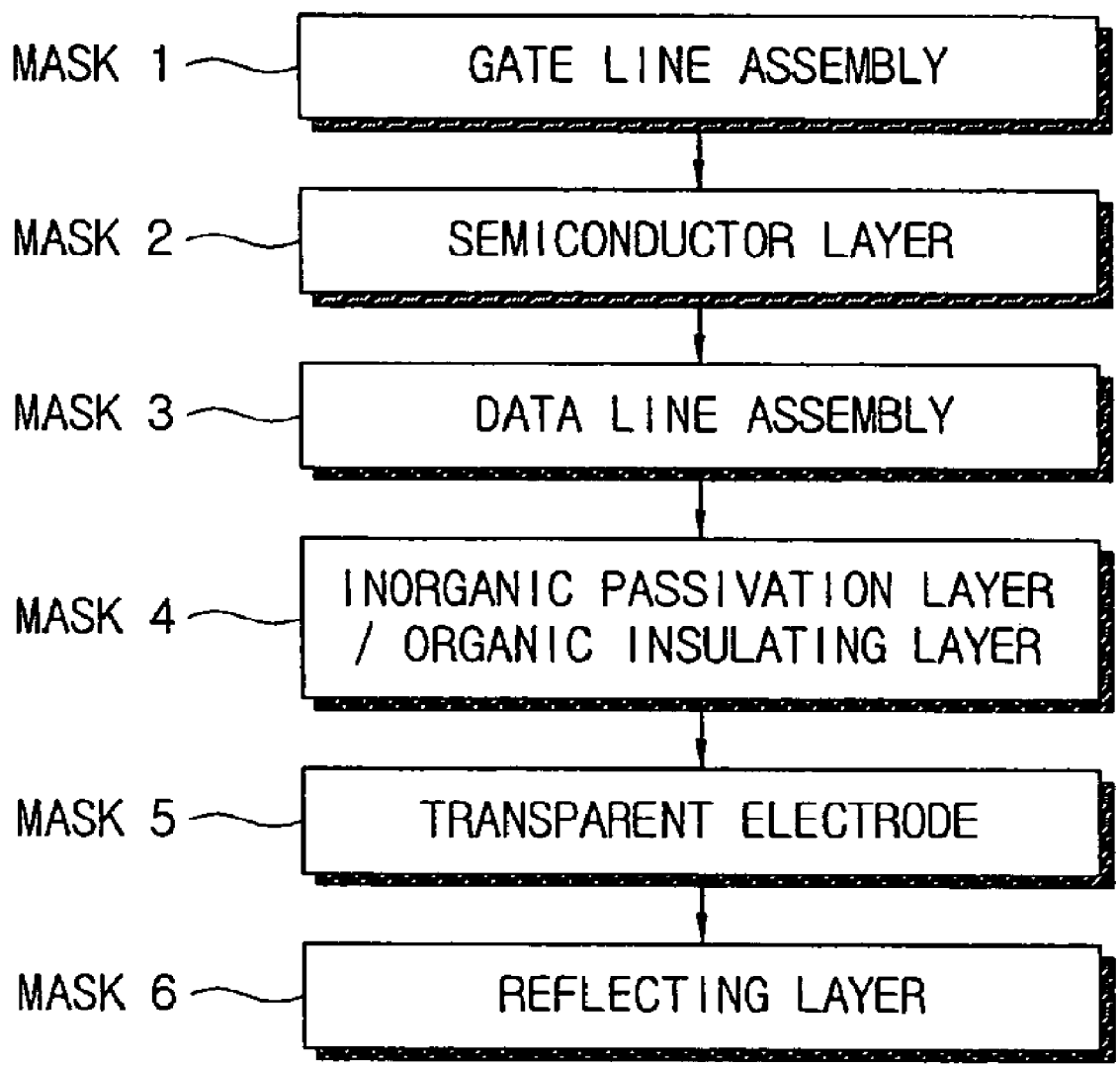
FIG. 4 is a flow chart showing the method of manufacturing the TFT substrate according to the first exemplary embodiment of the present invention.

FIG. 4 shows an order of manufacturing the TFT substrate 100 according to the first exemplary embodiment with respect to the masks used for the same.

First, the gate metal layer is deposited on the insulating substrate 110 and patterned (mask 1). In this process, the gate line 121, the gate electrode 122 and the gate pad 123 are formed.

The semiconductor layer 132 and the ohmic contact layer 133 are formed (mask 2). The semiconductor layer 132 is disposed on the gate electrode 122 and may be formed at the intersection of the gate line 121 and the data line 141.

Next, the data metal layer is deposited and patterned (mask 3). Thus, the data line 141, the source electrode 142, the drain electrode 143 and the data pad 144 are formed.

The inorganic passivation layer 151 and the organic insulating layer 152 are deposited and patterned (mask 4). Accordingly, the lens part 153 is formed on the organic insulating layer 152. Thereafter, the inorganic layers 131 and 151 are etched with the organic insulating layer 152 as a mask, thereby forming the contact holes 185, 186, 187 and 188.

Then, a transparent conducting layer is formed and patterned (mask 5) to form the transparent electrode 161, 162, 163. The transparent electrode 161, 162, 163 comprises the pixel electrode 161 and the auxiliary contact members 162 and 163. The pixel electrode 161 is formed on the organic insulating layer 152 and comprises the lens part 165 having the same shape as the lens part 153 on the organic insulating layer 152.

Finally, the reflecting layer 170 is deposited and patterned (mask 6). The reflecting layer 170 is formed on the lens part 165 of the pixel electrode 161 formed in the reflecting region and electrically connected to the drain electrode 143 through the pixel electrode 161.

Figure 5:
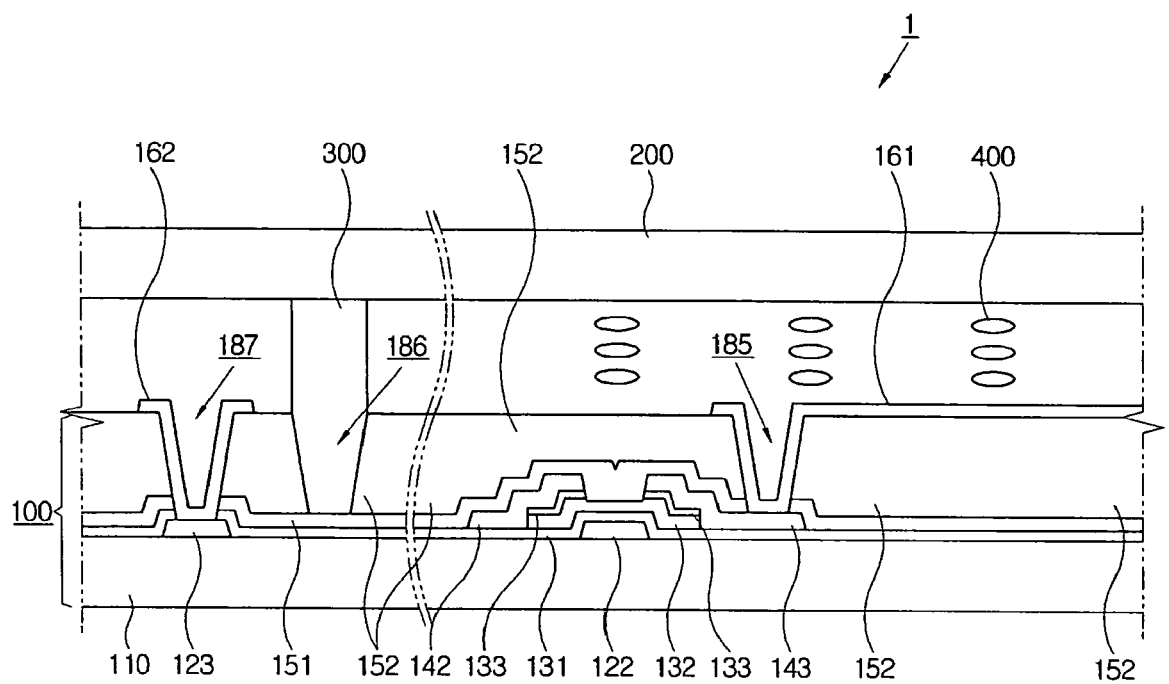
FIG. 5 is a cross-sectional view of a second exemplary embodiment of an LCD panel according to the present invention.
Figure 6:
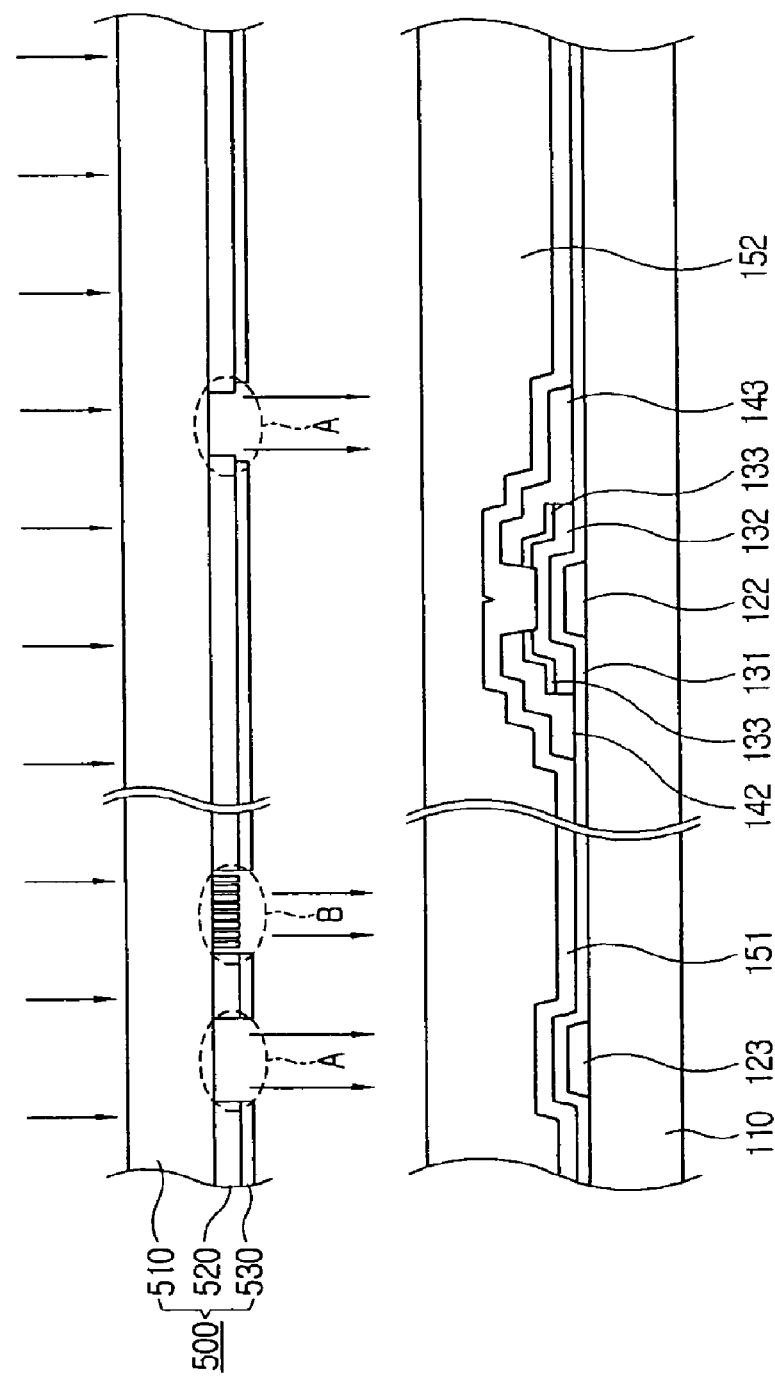
FIG. 6 is a cross-sectional view showing a second exemplary embodiment of a method of manufacturing a TFT substrate according to the present invention.

Hereinafter, a second exemplary embodiment of an LCD according to the present invention will be described with reference to FIGS. 5 and 6. FIG. 5 is a cross-sectional view of the second exemplary embodiment of an LCD panel 1 according to the present invention and FIG. 6 is a cross-sectional view of a TFT substrate 100 where a mask for an organic layer is disposed over the TFT substrate. Repeated descriptions will be omitted in the following description of the second exemplary embodiment.

Unlike the first exemplary embodiment, the second exemplary embodiment employs a transmissive TFT substrate 100. Thus, the TFT substrate 100 is patterned by the same process as the first exemplary embodiment until using a third mask, since a lens part 153 and a transmitting window 172 do not need to be formed as in FIG. 2 when the TFT substrate is patterned by a fourth mask. A mask 500 for an organic layer shown in FIG. 6 does not comprise an area C to form the lens part 153 and a slit area B to form the transmitting window 172 as compared with FIG. 3D or the first exemplary embodiment.

Furthermore, a reflecting layer 170 is not formed and a transparent conducting layer is patterned by a fifth mask to form a pixel electrode 161 and a contact member 162, thereby completing the transmissive TFT substrate with five masks unlike the first exemplary embodiment using six masks. The processes of making an LCD according to the second exemplary embodiment are the same as in the first exemplary embodiment.

Accordingly, the aforementioned second exemplary embodiment provides a method of making the LCD to prevent substrates separating from each other despite using one fewer mask.

Figure 7:
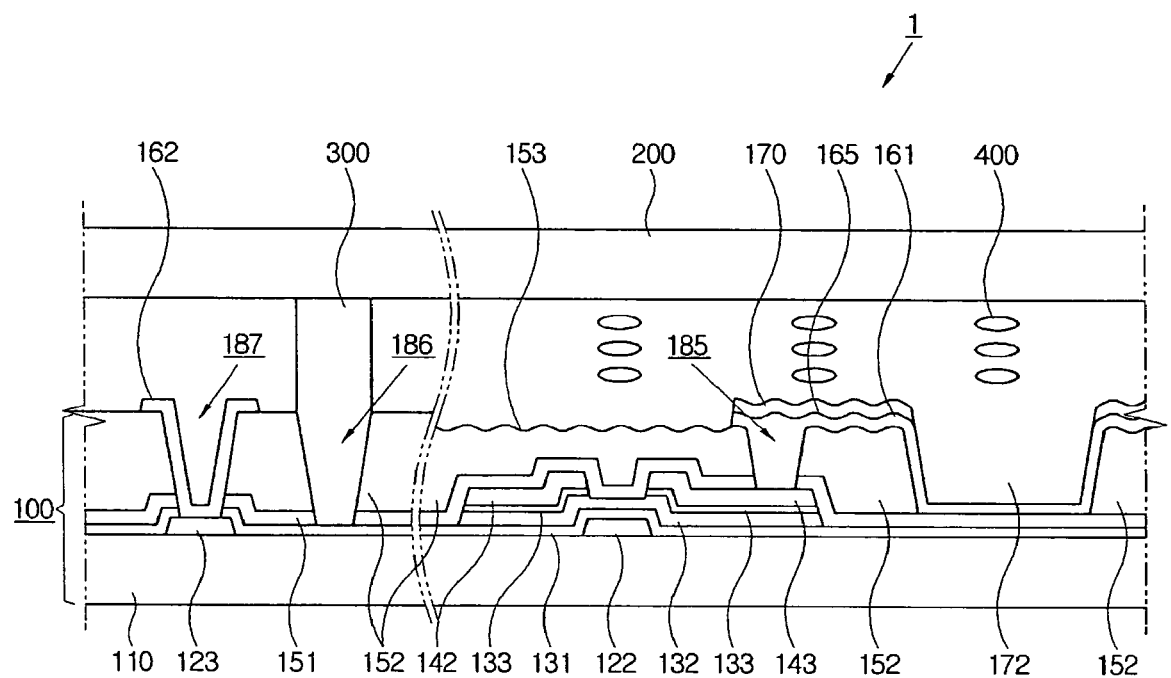
FIG. 7 is a cross-sectional view of a third exemplary embodiment of an LCD panel according to the present invention.

Herein below, an LCD panel according to a third exemplary embodiment of the present invention will be described with reference to FIG. 7.

An LCD panel according to a third exemplary embodiment of the present invention as well as the first exemplary embodiment is a transflective type having a reflecting region and a transmitting region. In the following descriptions, a difference of the LCD panel 1 according to the third exemplary embodiment from the first exemplary embodiment will be mentioned.

An inorganic passivation layer 151 is removed from a sealant contact hole 186 to expose a gate insulating layer 131. Thus, a sealant 300 contacts the gate insulating layer 131. The inorganic passivation layer 151 and the gate insulating layer 131 are both inorganic layers, thereby providing excellent adhesion to the sealant 300.

An ohmic contact layer 133 and a semiconductor layer 132 are disposed under a source electrode 142 and a drain electrode 143. The source electrode 142 and the drain electrode 143 overlap the ohmic contact layer 133 and the semiconductor layer 132 except in a channel region. The ohmic contact layer 133 and the semiconductor layer 132 may be disposed under a data line 141 and a data pad 144, not shown in drawings.

A method of manufacturing a TFT substrate according to the third exemplary embodiment will be described with reference to FIGS. 8A through 8G.

Figure 8A:
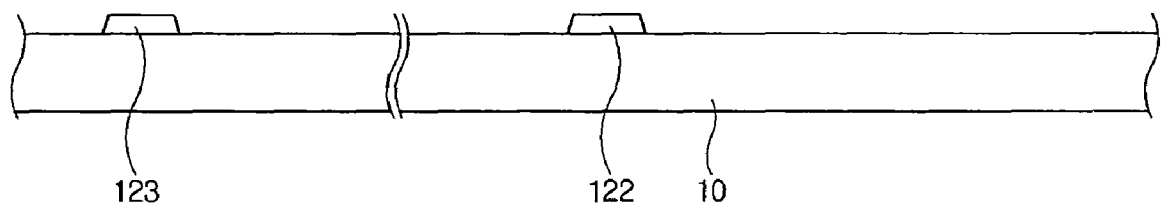
FIGS. 8A through 8G are cross-sectional views showing a third exemplary embodiment of a method of manufacturing a TFT substrate according to the present invention.

Referring to FIG. 8A, a gate metal layer is deposited on an insulating substrate 110 and patterned to form a gate line 121 (not shown), a gate electrode 122 and a gate pad 123.

Figure 8B:
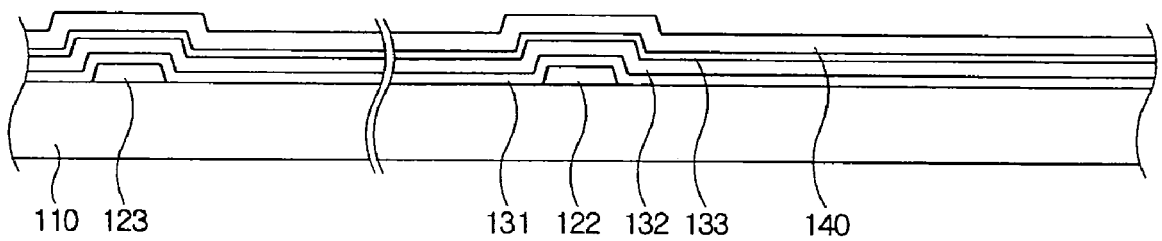

Referring to FIG. 8B, the gate insulating layer 131, the semiconductor layer 132, the ohmic contact layer 133 and a data line assembly layer 140 are sequentially formed.

Figure 8C:
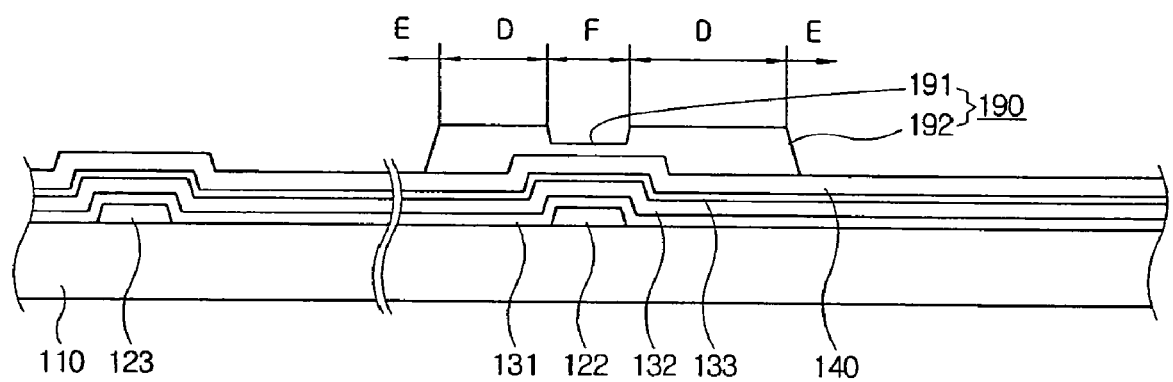

Referring to FIG. 8C, a photoresist 190 is irradiated with light through a mask to form photoresist patterns 191 and 192. A first part of pattern 191 is formed more thinly than a second part of pattern 192. That is, the first part of pattern 191 of the photoresist 190 in the channel region F of the TFT substrate disposed between the source electrode 142 and the drain electrode 143 is thinner than the second part of pattern 192 in a data line assembly region D where a data line assembly 141, 142, 143 and 144 is formed and is removed altogether from a region E. A thickness ratio of the first part of pattern 191 in the channel region F to the second part of pattern 192 in the data line assembly region D varies depending on conditions in an etching process, as will be further described below, but the first part of pattern 191 may preferably be about half or less thinner, such as about 4000 Å or less, than the second part of pattern 192.

There are various methods to change the thickness of the photoresist 190 depending on its portions. Further, a slit or a latticed pattern or a transflective layer is applied to the photoresist 190 to adjust the transmitting amount of the light in the channel region F.

In this case, it is preferable that the width of the pattern or an interval between the patterns 191 and 192 disposed between the slits, i.e. the width of the slit is less than a resolution of an exposure system. In a case of using the transflective layer, a thin layer having different transmittance or different thickness is used to manufacture a mask to control transmittance.

When light is irradiated to the photoresist through the mask, a polymer is resolved completely where it is directly exposed to the light, but is not completely resolved where the slit pattern or the transflective layer is formed since the light is slightly irradiated, and hardly resolved where it is shielded by shade. Then, when the photoresist is developed, polymer that is not resolved remains. The photoresist remains thinner in a middle portion where the light is slightly irradiated compared to where the light is not irradiated. At this point, all of the polymer is resolved if the exposing time is too long, and thus care should be taken to avoid excessive exposure.

The thinner photoresist part of the pattern 191 may be formed as follows. A photoresist comprised of a reflowing material is exposed with a mask divided into two areas where light is completely transmitted and where the light is not completely transmitted, developed and reflows to partly run down to where the photoresist does not remain.

Continuing, the photoresist 190 and the data line assembly layer 140, the ohmic contact layer 133 and the semiconductor layer 132, which are disposed under the photoresist 190, are etched. Here, the data line assembly layer 140, the ohmic contact layer 133 and the semiconductor layer 132 should remain in the data line assembly region D, the semiconductor layer 132 should remain only in the channel region F, and the data line assembly layer 140, the ohmic contact layer 133 and the semiconductor layer 132 are all removed to expose the gate insulating layer 131 in the region E.

Figure 8D:
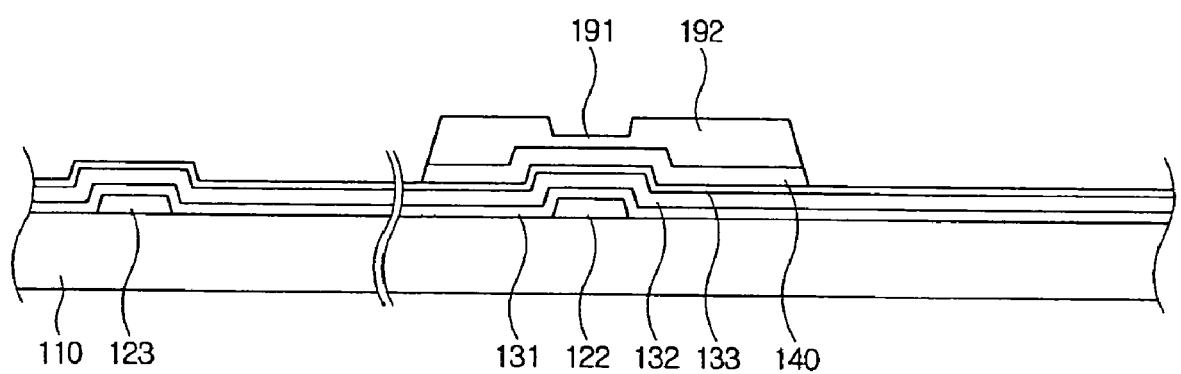

Referring to FIG. 8D, the data line assembly layer 140 is removed to expose the ohmic contact layer 133 in the region E. A dry etching and a wet etching are both used in this process, since it is preferable to perform etching under a condition such that the data line assembly layer 140 is etched and the photoresist patterns 191 and 192 are hardly etched. However, in case of the dry etching, it is difficult to etch only the data line assembly layer 140 while the photoresist patterns 191 and 192 are not etched. Thus, the photoresist patterns 191 and 192 may be etched as well. Therefore, the first part of pattern 191 in the dry etching is formed thicker than in the wet etching, so that the first part of pattern 191 is not removed so as to not expose the drain line assembly layer 140.

Then, the data line assembly layer 140 remains only in the channel region F and in the data line assembly region D and is removed to expose the ohmic contact layer 132 in the region E. The remaining data line assembly layer 140 is the same as the data line assembly 141, 142, 143 and 144 except that it is not divided into the source electrode 142 and the drain electrode 143. Here, the photoresist patterns 191 and 192 are etched to some degree in the case of using the dry etching.

Figure 8E:
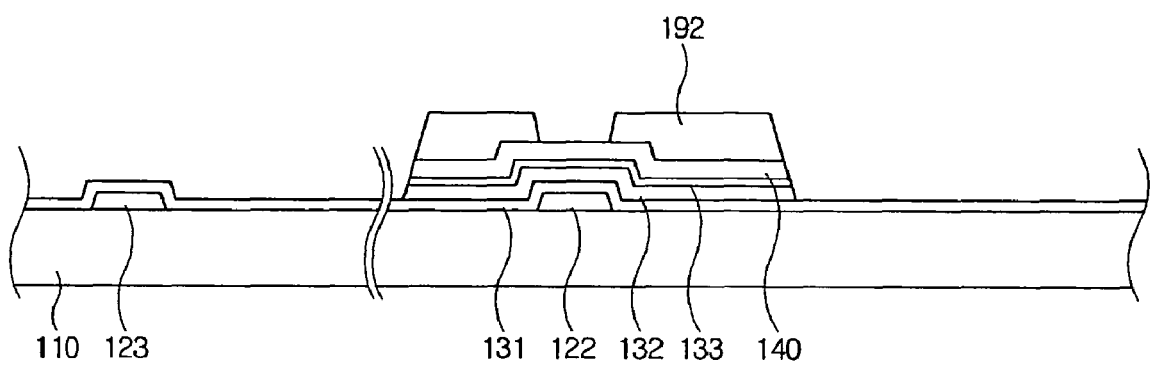

Referring to FIG. 8E, the ohmic contact layer 132 and the semiconductor layer 133 are removed along with the first part 191 of the photoresist at the same time from the region E by the dry etching. At this point, the etching should be performed under a condition that the photoresist patterns 191 and 192, the ohmic contact layer 133 and the semiconductor layer 132 (the ohmic contact layer and the semiconductor layer hardly have etching selectivity) are etched at the same time and the gate insulating layer 131 is not etched. It is preferably desirable that the photoresist patterns 191 and 192 and the semiconductor layer 132 are etched almost at the same ratio. For example, the photoresist patterns 191 and 192 and the semiconductor layer 132 may be etched to almost the same thickness using a mixed gas of $SF_6$ and HCl or $SF_6$ and $O_2$. If the photoresist patterns 191 and 192 and the semiconductor layer 132 are etched at the same ratio, the first part 191 has the same thickness or less than as a sum of the thicknesses of the semiconductor layer 132 and the ohmic contact layer 133 or less.

Then, as shown in FIG. 8E, the first part of pattern 191 in the channel region F is removed to expose the data line assembly layer 140 and the ohmic contact layer 133 and the semiconductor layer 132 in the region E are removed to expose the gate insulating layer 131. Meanwhile, the second part 192 in the data line assembly region D is etched as well to become thinner.

Then, photoresist remnants left on a surface of the data line assembly layer 140 in the channel region F are removed through asking.

Figure 8F:
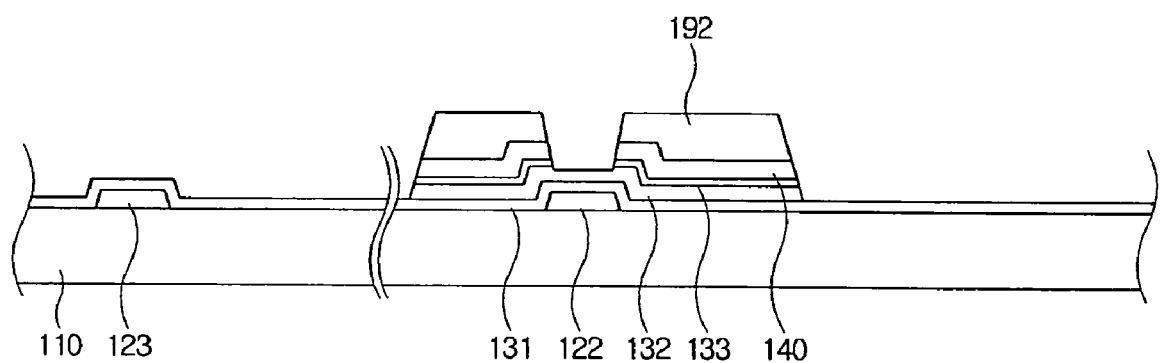

Referring to FIG. 8F, the data line assembly layer 140 and the ohmic contact layer 133 in the channel region F are etched to be removed. Here, the data line assembly layer 140 and the ohmic contact layer 133 may be both etched by the dry etching, or the data line assembly layer 140 may be etched by the wet etching and the ohmic contact layer 133 may be etched by the dry etching. In the former case of using the dry etching, it is preferable to etch the data line assembly layer 140 and the ohmic contact layer 133 under a condition a relatively high etching selectivity ratio of the data line assembly layer 140 and the ohmic contact layer 133. If the etching selectivity ratio is not high, it will be difficult to find an ending point of the etching, and thus making it difficult to adjust the thickness of the semiconductor layer 132 remaining in the channel region F. In the latter case of using the dry etching and the wet etching, a lateral side of the data line assembly layer 140 wet-etched is etched, while the ohmic contact layer 133 dry-etched is hardly etched, thereby forming a step shape in the lateral side of data line assembly layer 140. Mixed gas of $CF_4$ and HCl or $CF_4$ and $O_2$ is used as an etching gas to etch the ohmic contact layer 133 and the semiconductor layer 132, wherein the mixed gas of $CF_4$ and $O_2$ allows the semiconductor layer 132 to remain uniformly thick. At this point, the semiconductor layer 132 is made thinner by partly removing the same and the second part 192 is etched to some degree. In this case, the etching is performed under a condition such that the gate insulating layer 131 is not etched. Further, the photoresist pattern 192 is desirably thick enough so as to not expose the data line assembly 141, 142, 143 and 144 in the case that the second part of pattern 192 is etched.

Lastly, the second part of pattern 192 remaining in the data line assembly region D is removed. However, the second part of pattern 192 may be removed after removing the data line assembly layer 140 and before removing the ohmic contact layer 133 thereunder.

Figure 8G:
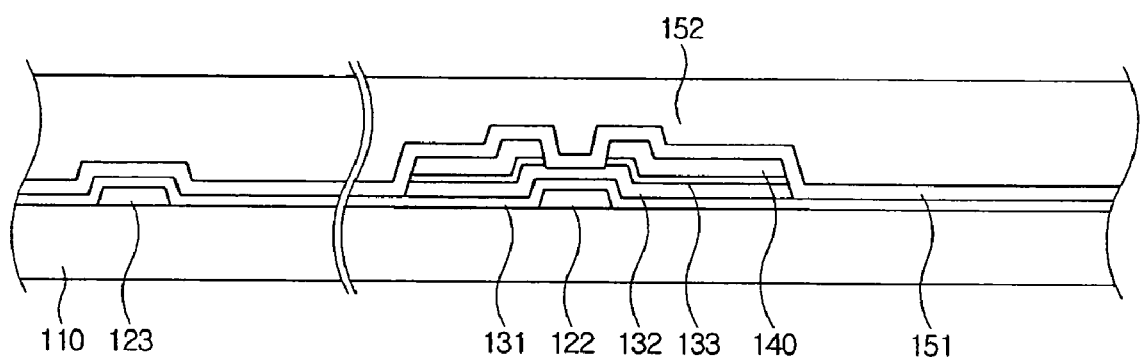

Referring to FIG. 8G, the inorganic layer 151 and the organic insulating 152 are sequentially formed.

The following processes are the same as the method of making the TFT of the first exemplary embodiment. However, a portion of the organic layer 152 that remains where the sealant contact hole 186 is disposed is less than the organic layer that remains in the first exemplary embodiment or is completely removed when exposed and developed so that the sealant contact hole 186 exposes the gate insulating layer 131.

Figure 9:
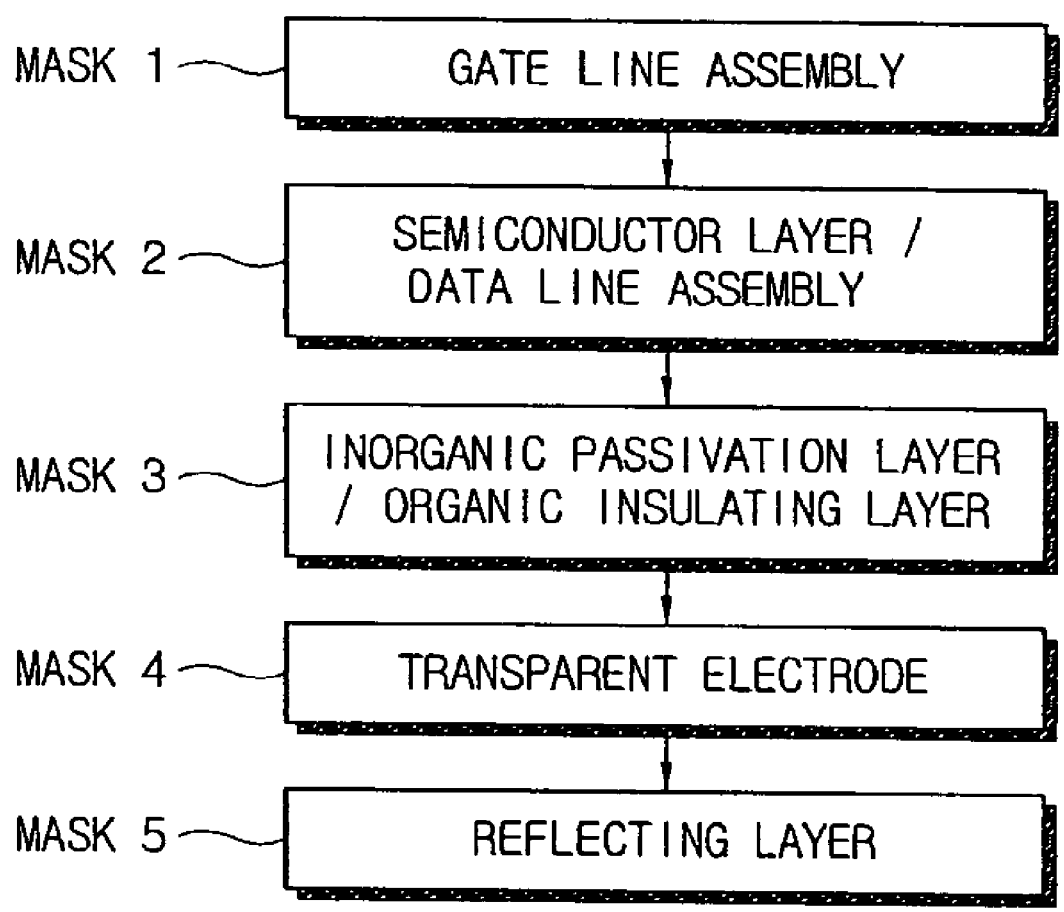
FIG. 9 is a flow chart showing the method of manufacturing the TFT substrate according to the third exemplary embodiment of the present invention.

FIG. 9 is a flow chart showing the method of manufacturing the TFT substrate according to the third exemplary embodiment of the present invention. As described above, the semiconductor layer 132 and the data line assembly 141, 142, 143 and 144 are formed with one mask in the third exemplary embodiment. Accordingly, the transflective TFT substrate is manufactured with one fewer mask in third exemplary embodiment than in the first exemplary embodiment. Further, the sealant 300 contacts a gate insulating layer 131 of an inorganic substance, and thus the substrates 100, 200 are prevented from separating from each other.

Figure 10:
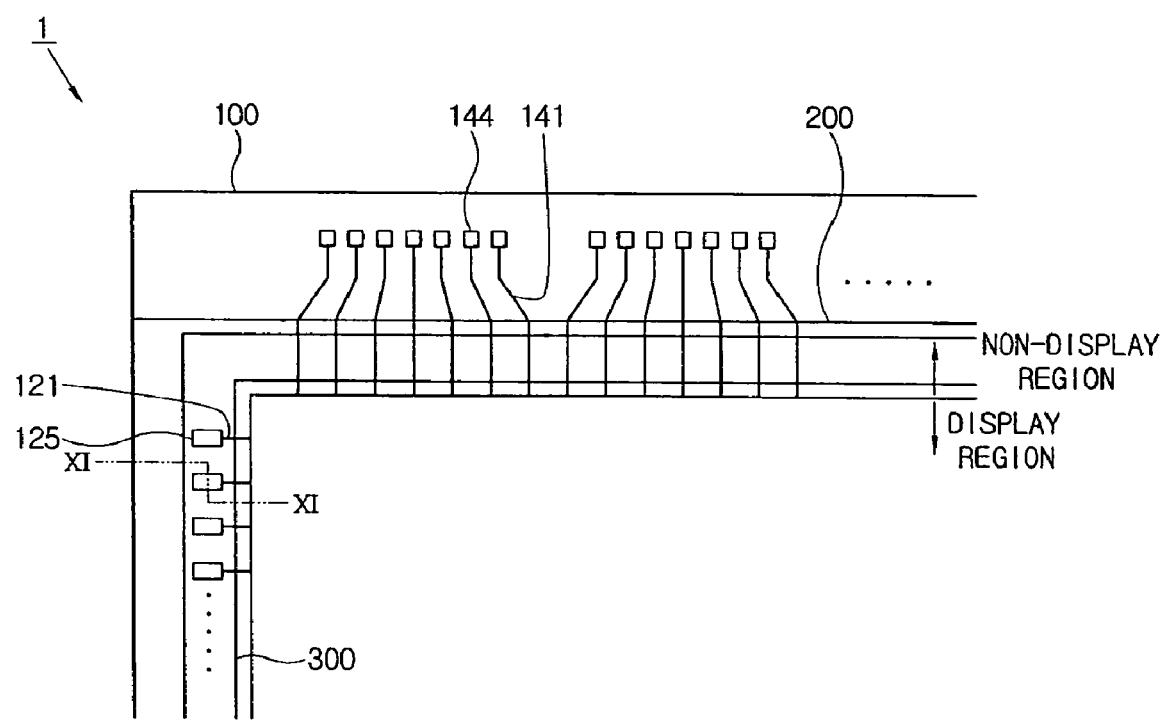
FIG. 10 is a plan view of a fourth exemplary embodiment of an LCD panel according to the present invention.
Figure 11:
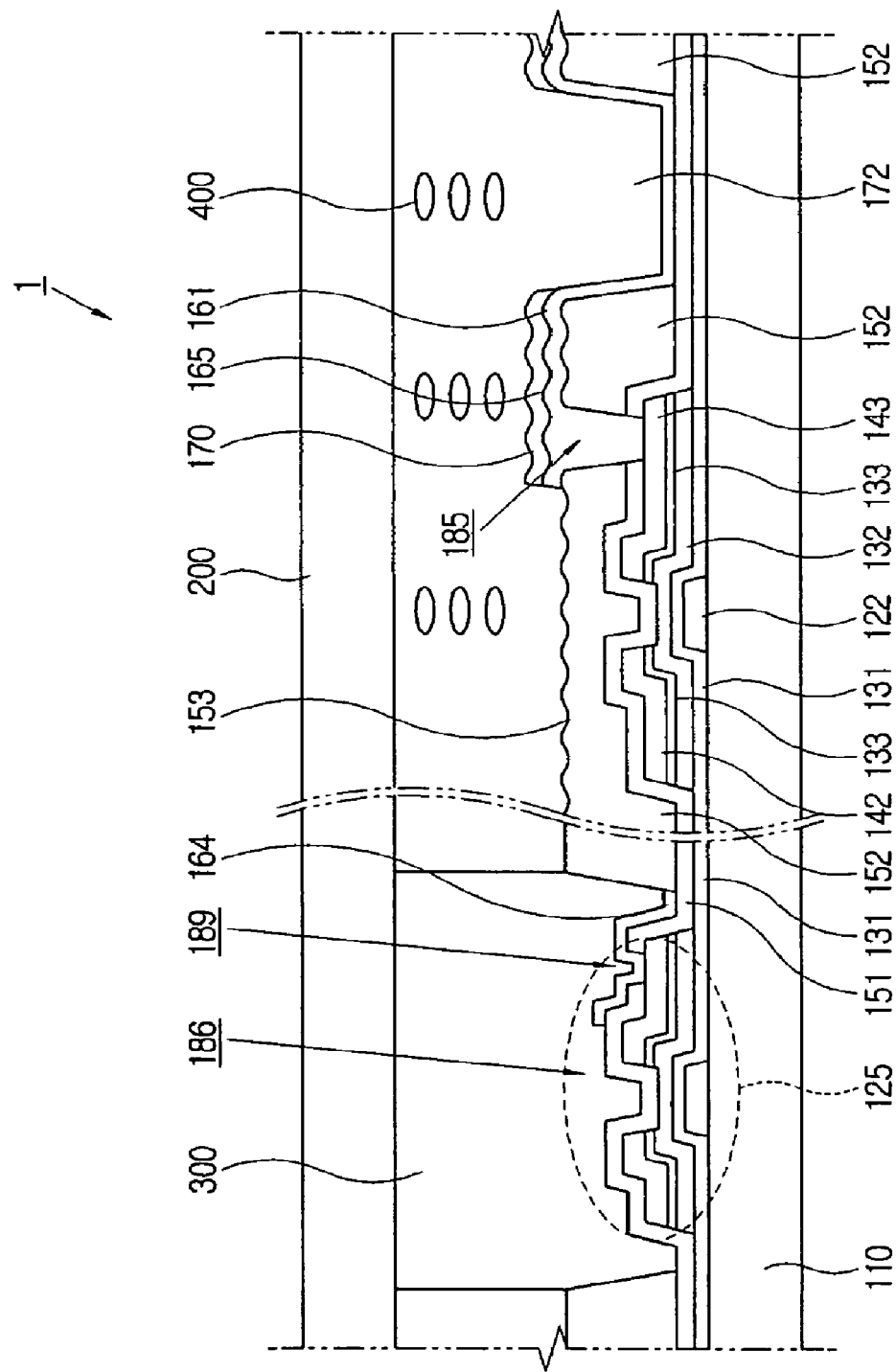
FIG. 11 is a cross-sectional view of the LCD panel taken along line XI-XI of FIG. 10.

Hereinafter, a fourth exemplary embodiment of an LCD panel according to the present invention will be described with reference to FIGS. 10 and 11. FIG. 10 is a plan view of the LCD panel according to the fourth exemplary embodiment of the present invention. FIG. 11 is a cross-sectional view of the LCD panel 1 taken along line XI-XI of FIG. 10.

A gate driving circuit 125 is provided at an end of a gate line 121 instead of a gate pad 123. The gate driving circuit 125 is called a shift register and is formed while a TFT substrate 100 is formed. The gate driving circuit 125 comprises a plurality of TFTs, but only one TFT is shown in FIG. 11 for description.

According to the fourth exemplary embodiment, a sealant 300 is formed on the gate driving circuit 125. Here, an organic insulating layer 172 is removed from the gate driving circuit 125, and thus a sealant contact hole 186 is formed thereon. Further, a gate driving circuit contact hole 189 is provided on an inorganic passivation layer 151 on the gate driving circuit 125 to expose the gate driving circuit 125. A gate driving circuit transparent electrode 164 is connected to the gate driving circuit 125 through the gate driving circuit contact hole 189.

According to the fourth exemplary embodiment, the sealant 300 is formed on the inorganic passivation layer 151, thereby preventing substrates 100, 200 from separating from each other.

Figure 12:
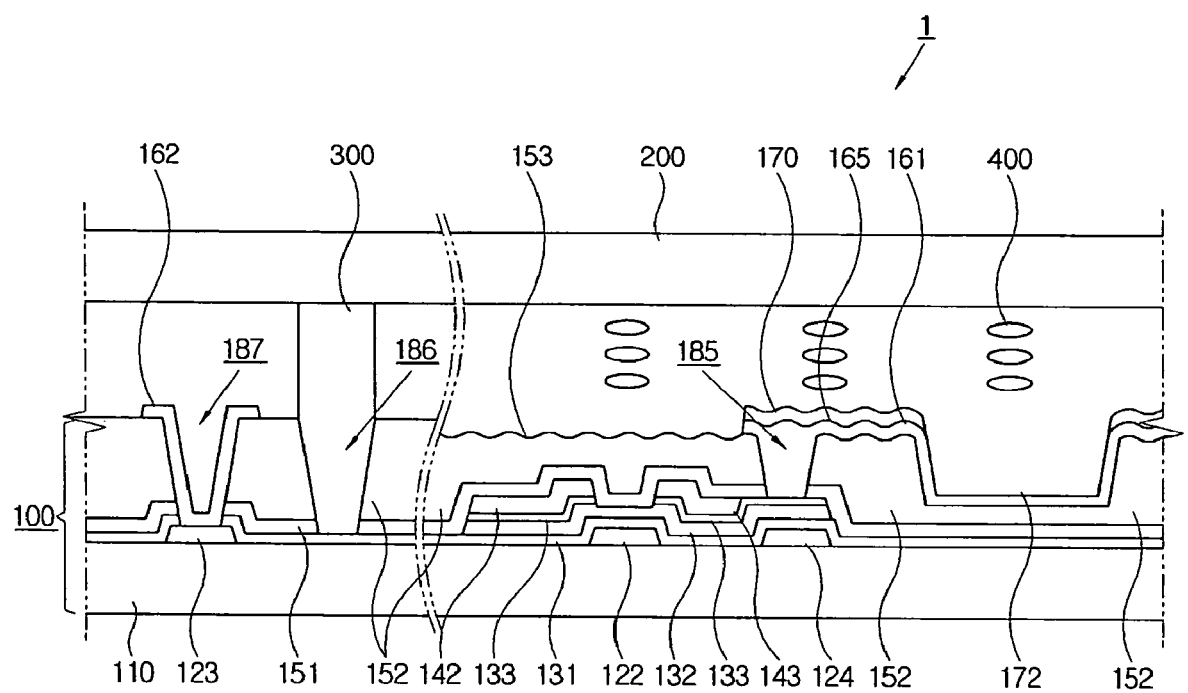
FIG. 12 is a cross-sectional view of a fifth exemplary embodiment of a TFT substrate of an LCD panel according to the present invention.

Hereinafter, a fifth exemplary embodiment of an LCD panel according to the present invention will be described with reference to FIG. 12.

An LCD panel 1 according to a fifth exemplary embodiment is a transflective type having a reflecting region and a transmitting region, the same as in the third exemplary embodiment. In the following descriptions, a difference of the LCD panel 1 according to the fifth exemplary embodiment from the third exemplary embodiment will be mentioned.

A storage electrode line 124 is formed below a drain electrode 143. A gate insulating layer 131, a semiconductor layer 132 and an ohmic contact layer 133 are disposed between the drain electrode 143 and the storage electrode line 124. The storage electrode line 124 forms storage capacity along with the drain electrode 143.

An organic layer 152 is disposed in the transmitting region unlike the second exemplary embodiment. Thus, transmittance decreases, while a profit margin with respect to a manufacturing process of the fifth exemplary embodiment increases.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A method of making a liquid crystal display having a display region and a non-display region, the method comprising:
    forming a thin film transistor (TFT) having a drain electrode on an insulating substrate;
    forming an inorganic layer and an organic insulating layer sequentially on the TFT;
    forming an organic insulating layer pattern, by patterning the organic insulating layer, comprising a first organic layer hole to expose the inorganic layer on the drain electrode and a second organic layer hole formed along a circumference of the display region where the organic insulating layer is partially removed;
    removing the inorganic layer exposed through the first organic layer hole and the organic insulating layer remaining in the second organic layer hole; and
    forming a sealant in the second organic hole.

2. The method of making a liquid crystal display according to claim 1, wherein the forming the organic insulating layer pattern comprises forming a lens part on the display region.

3. The method of making a liquid crystal display according to claim 2, wherein the forming the organic insulating layer pattern comprises exposing the organic insulating layer to light, an exposure intensity of light is about 70 percent to about 80 percent in an area of the second organic layer hole and about 20 percent to about 32 percent in an area of the lens part as compared with exposure in an area of the first organic layer hole.

4. The method of making a liquid crystal display according to claim 2, wherein the forming the organic insulating layer pattern further comprises exposing the organic insulating layer to light with a mask for an organic layer, the mask for the organic layer comprises a molybdenum silicon layer corresponding to the lens part and a slit-patterned molybdenum silicon layer corresponding to the second organic layer hole.

5. The method of making a liquid crystal display according to claim 1, further comprising forming a pixel electrode connected to the drain electrode; and forming a reflecting layer connected to the pixel electrode, the reflecting layer having a transmitting window.

6. The method of making a liquid crystal display according to claim 1, wherein the inorganic layer comprises at least one of silicon oxide and silicon nitride.

7. The method of making a liquid crystal display according to claim 1, wherein the organic insulating layer comprises either benzocyclobutene or acrylic resin.

8. The method of making a liquid crystal display according to claim 1, wherein the inorganic layer comprises a gate insulating layer and an inorganic passivation layer.

9. The method of making a liquid crystal display according to claim 1, wherein the forming the TFT comprises forming a gate line assembly and sequentially forming a gate insulating layer, a semiconductor layer, an ohmic contact layer and a data line assembly on the gate line assembly.

10. The method of making a liquid crystal display according to claim 9, wherein the semiconductor layer, the ohmic contact layer and the data line assembly are patterned using a single mask.

11. The method of making a liquid crystal display according to claim 10, wherein the ohmic contact layer and the data line assembly are patterned to be layered upon other.

12. The method of making a liquid crystal display according to claim 1, further comprising adhering the insulating substrate to another substrate with the sealant to prevent separation thereof.

13. A method of making a liquid crystal display having a display region and a non-display region, the method comprising:
    forming a thin film transistor (TFT) having a drain electrode on an insulating substrate;
    forming an inorganic layer and an organic insulating layer sequentially on the TFT;
    forming an organic insulating layer pattern, by patterning the organic insulating layer, comprising a first organic layer hole to expose the inorganic layer on the drain electrode and a second organic layer hole formed along a circumference of the display region;
    removing the inorganic layer exposed through the first organic layer hole and the inorganic layer remaining in the second organic layer hole; and
    forming a sealant in the second organic hole.

14. The method of making a liquid crystal display according to claim 13, further comprising adhering the insulating substrate to another substrate with the sealant to prevent separation thereof.

* * * * *